United States Patent
Cousinard

(10) Patent No.: US 9,264,028 B2
(45) Date of Patent: Feb. 16, 2016

(54) ZERO CROSSING DETECTOR USING CURRENT MODE APPROACH

(71) Applicant: Marvell World Trade Ltd., St. Michael (BB)

(72) Inventor: David Cousinard, Morges (CH)

(73) Assignee: MARVELL WORLD TRADE LTD., St. Michael (BB)

(*) Notice: Subject to any disclaimer, the term of this patent is extended or adjusted under 35 U.S.C. 154(b) by 147 days.

(21) Appl. No.: 14/103,803

(22) Filed: Dec. 11, 2013

(65) Prior Publication Data

US 2014/0176194 A1 Jun. 26, 2014

Related U.S. Application Data

(60) Provisional application No. 61/740,288, filed on Dec. 20, 2012.

(51) Int. Cl.
*H03K 5/153* (2006.01)
*H03K 5/1536* (2006.01)
*G01R 19/175* (2006.01)

(52) U.S. Cl.
CPC ............ *H03K 5/1536* (2013.01); *G01R 19/175* (2013.01)

(58) Field of Classification Search
CPC .......................... H03K 5/1536; G01R 19/175
See application file for complete search history.

(56) References Cited

U.S. PATENT DOCUMENTS

| | | | |
|---|---|---|---|
| 4,399,414 A | 8/1983 | Bird | |
| 5,043,653 A * | 8/1991 | Foster et al. | 322/32 |
| 7,362,149 B1 | 4/2008 | Cheah et al. | |
| 8,493,098 B1 * | 7/2013 | Tousignant | H03K 5/24 327/78 |
| 8,917,115 B2 * | 12/2014 | Gonzalez Moreno | G01R 19/175 327/78 |
| 2011/0279163 A1 | 11/2011 | Barnett et al. | |
| 2014/0355697 A1 * | 12/2014 | Magin | H04L 1/004 375/257 |

FOREIGN PATENT DOCUMENTS

| | | |
|---|---|---|
| CA | 2628211 A1 | 1/2003 |
| CN | 102707127 A | 3/2012 |
| DE | 3142558 A1 | 6/1982 |
| DE | 19642871 A1 | 4/1998 |
| DE | 102005030634 A1 | 1/2007 |
| EP | 2104401 A1 | 9/2009 |
| FR | 2876799 A1 | 4/2006 |
| JP | 2004-150914 A | 5/2004 |

OTHER PUBLICATIONS

International Search Report and Written Opinion for PCT/IB2013/001374 dated Nov. 18, 2013.
International Search Report and Written Opinion for PCT/IB2013/002742, filed on Dec. 12, 2013.

* cited by examiner

*Primary Examiner* — Lincoln Donovan
*Assistant Examiner* — Colleen O Toole

(57) ABSTRACT

An apparatus includes a signal converter configured to convert a voltage signal into a current signal and an analog digital converter (ADC) configured to convert the current signal to a digital signal. The apparatus also includes a digital processor configured to process the digital signal and generate an output signal that indicates a zero crossing point of the mains voltage signal.

18 Claims, 5 Drawing Sheets

ZERO CROSSING DETECTOR USING CURRENT MODE APPROACH

CROSS-REFERENCE TO RELATED APPLICATION

This present disclosure claims the benefit of U.S. Provisional Application No. 61/740,288, "ZERO CROSSING DETECTOR USING CURRENT MODE APPROACH," filed on Dec. 20, 2012, which is incorporated by reference herein in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Mains electricity is a type of electric power supply. A mains voltage signal is distributed and used to power various systems and devices that require power, e.g., lighting devices, portable appliances, and networked nodes including multimedia home networking nodes. A mains voltage signal is also commonly referred to as a line voltage or as a domestic mains signal.

A zero crossing detector, which detects zero crossing points of the mains voltage signal, is typically used to synchronize other voltage signals with the mains voltage signal. This synchronization of the mains voltage allows for synchronized communications among and/or between the circuits in a network.

SUMMARY

In an embodiment, an apparatus includes a signal converter configured to convert a voltage signal into a current signal, an analog digital converter (ADC) configured to convert the current signal to a digital signal. The apparatus also includes a digital processor configured to process the digital signal and generate an output signal that indicates a zero crossing point of the mains voltage signal.

In an embodiment, a method includes converting a voltage signal into a current signal, converting the current signal into a digital signal, and processing the digital signal to generate an output signal. The output signal indicates a zero crossing point of the mains voltage signal.

BRIEF DESCRIPTION OF THE DRAWINGS

Various embodiments of this disclosure that are proposed as examples will be described, in detail with reference to the following figures, wherein like numerals reference like elements, and wherein.

DETAILED DESCRIPTION OF EMBODIMENTS

Figure 1:
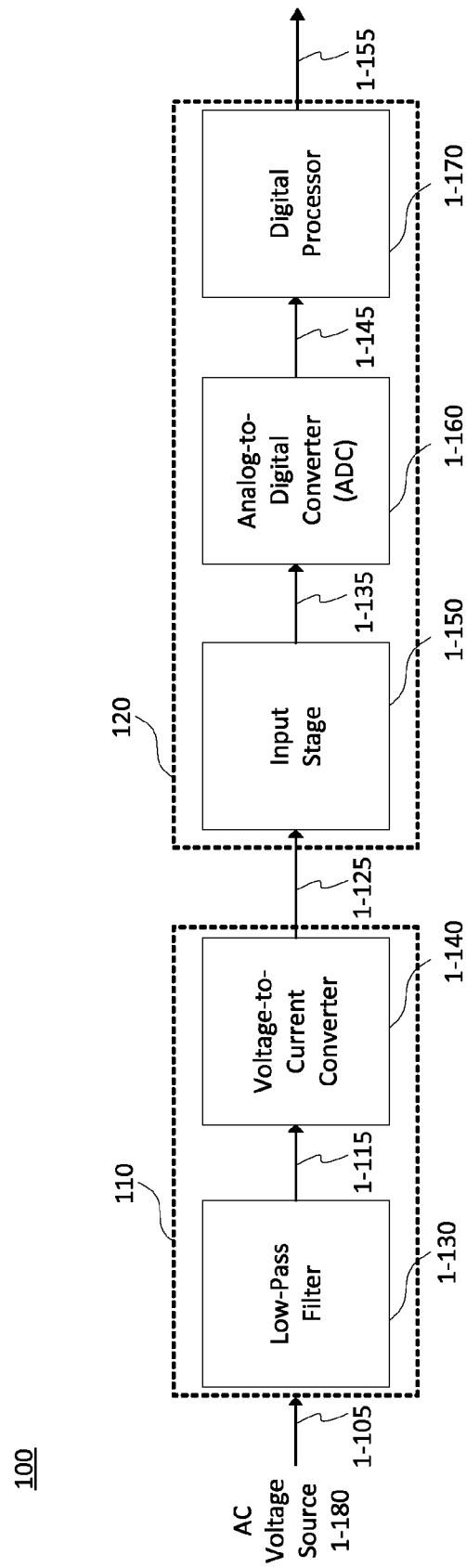
FIG. 1 is a block diagram of a system with a zero crossing detection (ZCD) circuit in accordance with an embodiment.

FIG. 1 is a block diagram of a system 100 with a zero crossing detection (ZCD) circuit 120 according to an embodiment. The system 100 includes an AC voltage source 1-180, a signal converter 110, and the ZCD circuit 120. The AC voltage source 1-180 supplies a mains voltage signal 1-105 along power lines. In an embodiment, the mains voltage signal 1-105 is supplied in the form of differential signals.

The signal converter 110 receives the mains voltage signal 1-105 and converts the mains voltage signal 1-105 into a converted current signal 1-125. In an embodiment, the signal converter 110 includes a low-pass filter (LPF) 1-130 and a voltage-to-current converter 1-140.

The LPF 1-130 reduces noise in the mains voltage signal 1-105 and Output a filtered voltage signal 1-115. In an embodiment, the LPF 1-130 includes a plurality of capacitors and an inductor coupled to the plurality of capacitors. An exemplary LPF is explained below in connection with FIG. 2.

The voltage-to-current converter 1-140 converts the filtered voltage signal 1-115 into the converted current signal 1-125. In an embodiment, the voltage-to-current converter 1-140 includes a printed circuit board (PCB) capacitor to convert the voltage signal 1-115 into the current signal 1-125. The PCB capacitor may also be used for high-voltage isolation of the ZCD circuit 120.

The ZED circuit 120 receives the converted current signal 1-125 and generates an output signal 1-155 for use in determining the zero crossing points of the mains voltage signal 1-105. For example, the zero crossing points of the output signal 1-155 corresponds to those of the mains voltage signal 1-105, thereby indicating the zero crossing points of the mains voltage signal 1-105. In an embodiment, the ZCD circuit 120 includes an input stage 1-150, an analog-to-digital converter (ADC) 1-160, and a digital processor 1-170.

The input stage 1-150 of the ZCD circuit 120 receives the converted current signal 1-125 and provides an analog current signal 1-135 to the ADC 1-160. In an embodiment, the input stage 1-150 has a lower impedance value than the resistance value of a parasitic resistor coupled to the input stage 1-150. As a result, a leakage current flowing through the parasitic resistor is reduced and the converted current signal 1-125 becomes less dependent on a variation in the resistance value of the parasitic resistor. For example, the parasitic resistor includes a resistor resulting from an electrostatic discharge protection (ESD) component coupled to a pad of the input stage 1-150.

The ADC 1-160 of the ZCD circuit 120 receives the analog current signal 1-135 and provides a digital signal 1-145 to the digital processor 1-170. In an embodiment, the digital signal 1-145 has a pulse-frequency that is proportional to a magnitude of the analog current signal 1-135 during a time interval.

The digital processor 1-170 of the ZCD circuit 120 receives the digital signal 1-145 and generates an output signal 1-155 indicating zero-crossing points of the mains voltage signal 1-105. In an embodiment, the digital processor 1-170 includes a digital filter, a digital comparator, and a compensator. An exemplary digital processor is explained below in connection with FIG. 3.

In an embodiment, the digital filter of the digital processor 1-170 includes a decimation filter and/or a bandpass filter to generate a sinusoidal waveform. The digital comparator is used to detect zero-crossings of the sinusoidal waveform. The digital compensator compensates for phase shifts caused by the digital filter and the voltage-to-current converter 1-140 and outputs the output signal 1-155 indicating the zero-crossings of the mains voltage signal 1-105.

Figure 2:
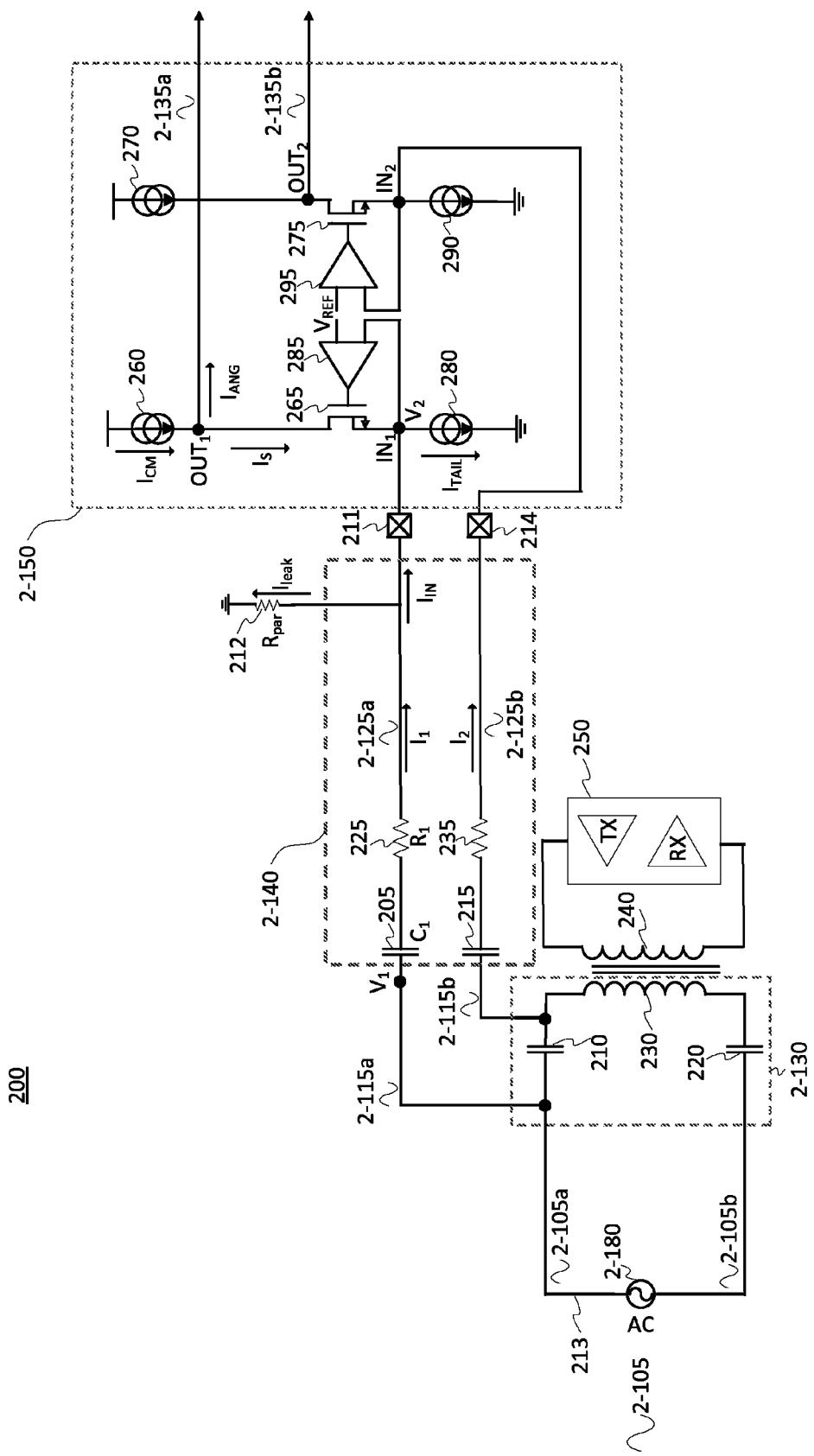
FIG. 2 is a diagram of a system with an input stage of a ZCD circuit in accordance with an embodiment.

FIG. 2 illustrates a system 200 with an input stage 2-150 of a ZCD circuit according to an embodiment. The system 200 includes an AC voltage source 2-180, an LPF 2-130, a voltage-to-current converter 2-140, an analog front end 250, and the input stage 2-150.

The AC voltage source 2-180 provides a mains voltage signal 2-105 along a power line 213. For example, the mains voltage signal 2-105 has a magnitude of 220V and a frequency of 50 Hz.

In an embodiment, the mains voltage signal 2-105 includes first and second differential voltage signals 2-105a and 2-105b. The first differential voltage signal 2-105a has substantially the same amplitude and frequency as the second differential voltage signal 2-105b, but is phase-shifted by 180 degrees from the second differential voltage signal 2-105b.

The LPF 2-130 filters the first and second differential voltage signals 2-105a and 2-105b and provides filtered voltage signals 2-115a and 2-115b to the voltage-to-current converter 2-140. In an embodiment, the LPF 2-130 includes a primary winding 230 and first and second capacitors 210 and 220. The first and second capacitors 210 and 220 are connected to the primary winding 230 to form an LC circuit that acts as a low-pass filter. As a result, high frequency noise superimposed on the differential voltage signals 2-105a and 2-105b is removed to generate the filtered voltage signals 2-115a and 2-115b.

In an embodiment, the first and second capacitors 210 and 220 act as capacitive dividers to generate voltage levels across the first and second capacitors 210 and 220. Since a voltage level across the first capacitor 210 is smaller than a level of a corresponding voltage of the mains voltage signal 2-105, the amplitude of the filtered voltage signals 2-115a and 2-115b is smaller than the amplitude of the mains voltage signals 2-105a and 2-105b, respectively.

The voltage-to-current converter 2-140 receives the filtered voltage signals 2-115a and 2-115b and converts the voltage signals 2-115a and 2-115b into first and second converted current signals 2-125a and 2-125b. The first and second converted current signals 2-125a and 2-125b are phase-shifted from the first and second filtered voltage signals 2-115a and 1-115b by 90 degrees.

In an embodiment, the voltage-to-current converter 2-140 includes PCB capacitors 205 and 215 and resistors 225 and 235. A first end of a first PCB capacitor 205 is connected to a first end of the first capacitor 210 and a second end of the first PCB capacitor 205 is connected to a first resistor 225. A first end of a second PCB capacitor 215 is connected to a second end of the first capacitor 210 and a second end of the second PCB capacitor 215 is connected to a second resistor 235.

The first and second PCB capacitors 205 and 215 generate current signals having a phase shift of 90 degrees with respect to the filtered voltage signals 2-115a and 2-115b, respectively. For example, the capacitance values of the PCB capacitors 205 and 215 are about 10 pF and the magnitude of the converted current signals 2-125a and 2-125b are about 10 nA.

Figure 3:
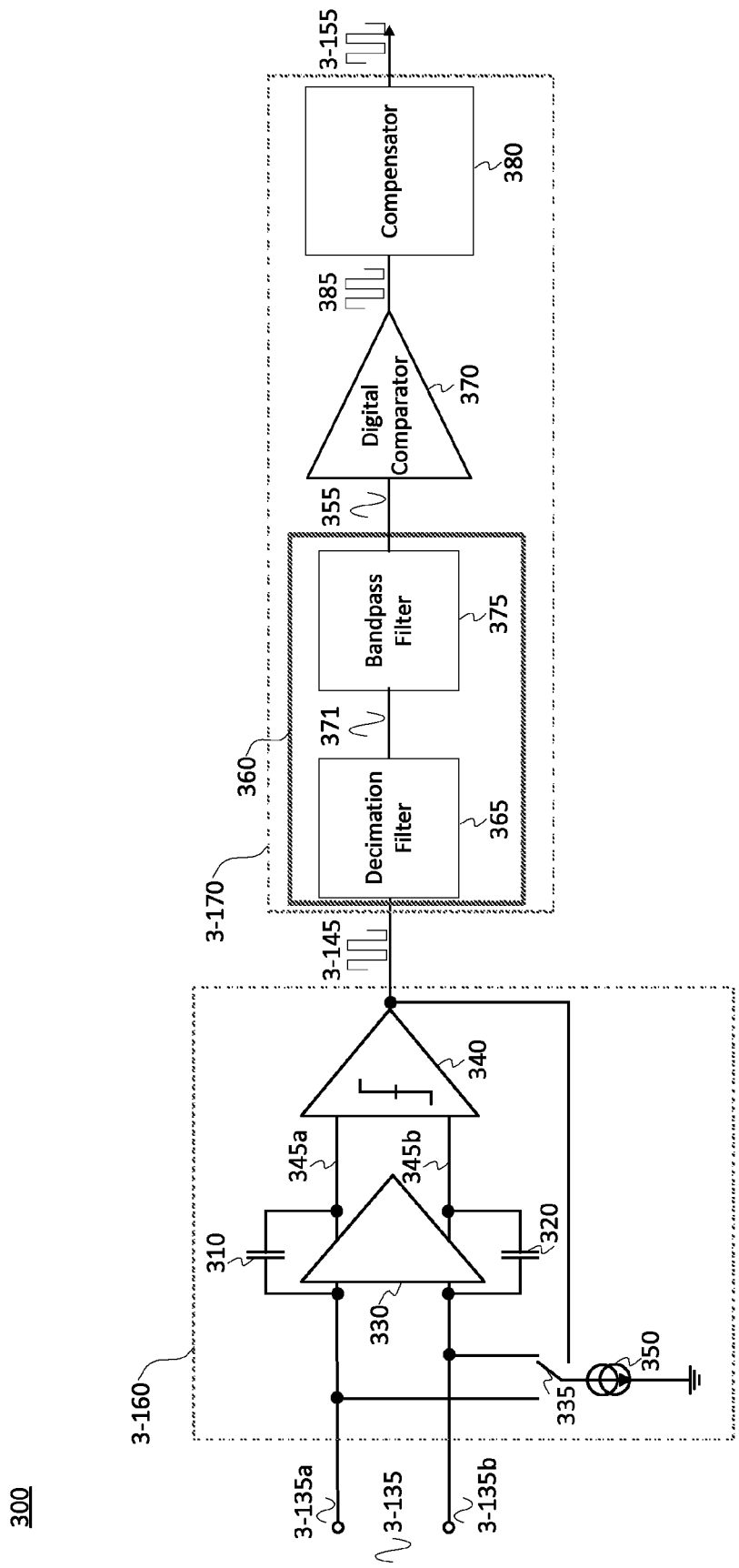
FIG. 3 is a diagram of a system with a sigma-delta analog digital converter (ADC) and a digital processor in accordance with an embodiment.

The input stage 2-150 provides analog current signals 2-135a and 2-135b to ADC 3-160 (see FIG. 3). As a result, the ADC 3-160 performs an analog-to-digital conversion operation. In an embodiment, the ADC input range is wider than that of the analog current signals 2-135a and 2-135b so that an output of the ADC 3-145 (see FIG. 3) can capture the full waveform of the analog current signals 2-135a and 2-135b.

In an embodiment, the first and second resistors 225 and 235 having a sufficiently large resistance value to keep the magnitude of the generated current signals below the ADC input range are inserted between each of the capacitors 205 and 215 and the input stage 2-150. The resistance value of the first and second resistors 225 and 235 may not be too large to introduce a significant phase shift on the input signal, which leads to inaccuracy in the zero-crossing detection. For example, the first and second resistors 225 and 235 each have a resistance value about 100KΩ.

As a result, first and second currents $I_1$ and $I_2$ corresponding to the first and second converted current signals 2-125a and 2-125b with a magnitude less than the threshold value flow into the input stage 2-150. Subsequently, the input stage 2-150 generates the analog current signals 2-135a and 2-135b corresponding to the converted current signals 2-125a and 2-125b, so that a magnitude of the analog current signals 2-135a and 2-135b is smaller than the threshold value for normal operation of the ADC 3-160.

Operation of the voltage-to-current converter 2-140 is described below in more detail. For illustrative convenience, the operation of the voltage-to-current converter 2-140 is explained with reference to the first filtered voltage signal 2-115a and the first converted current signal 2-125a. However, a person of skilled in the art will understand that similar operations of the voltage-to-current converter 2-140 are also applicable to the second filtered voltage signal 2-115b and the second converted current signal 2-125b.

The first current $I_1$ (or intermediate current signal) corresponding to the first converted current signal 2-215a flows through the first resistor 225 and is represented by Equation 1:

$$I_1 = \frac{V_1 - V_2}{R_1 + \frac{1}{jwC_1}}. \qquad \text{Equation 1}$$

In Equation 1, $V_1$ denotes a voltage level of the first filtered voltage signal 2-115a and $V_2$ denotes a voltage level at a first input node $IN_1$ of the input stage 2-150. $R_1$ denotes a resistance value of the first resistor 225 and $C_1$ denotes a capacitance value of the first PCB capacitor 205.

Assuming a parasitic resistor 212 is connected to the input pad 211, a leakage current $I_{leak}$ flowing through the parasitic resistor 212 is represented as follows:

$$I_{leak} = \frac{V_2}{R_{par}}. \qquad \text{Equation 2}$$

Here, $R_{par}$ denotes a resistance value of the parasitic resistor 212.

An input current $I_{IN}$ (or converted current signal) flowing into a first input node $IN_1$ of the input stage 2-150 corresponds to a difference between the first current $I_1$ and the leakage current $I_{leak}$. Thus, the input current $I_{IN}$ flowing into the input stage 2-150 is represented by:

$$I_{IN} = I_1 - I_{leak} = \frac{V_1 - V_2}{R_1 + \frac{1}{jwC_1}} - \frac{V_2}{R_{par}}. \qquad \text{Equation 3}$$

According to the first term of Equation 3, the input current $I_{IN}$ has phase shills due to the resistance value $R_1$ of the first resistor 225, the voltage level $V_2$ at the first input node $IN_1$, and the capacitance value $C_1$ of the first PCB capacitor 205.

In an embodiment, the resistance value $R_1$ of the first resistor 225 is sufficiently smaller than the impedance value of the first PCB capacitor 205 such that a phase shift of the input current $I_{IN}$ due to the first resistor 225 is insignificant. For example, when the resistance value $R_1$ of the first resistor 225 is about 100 KΩ and the capacitance value $C_1$ of the first PCB capacitor 205 is about 10 pF, a zero-crossing detection error is about 1 μs for the first filtered voltage signal 2-115a having 50 Hz frequency.

A phase shift of the input current $I_{IN}$ also occurs when the voltage level $V_2$ at the first input node $IN_1$ varies with a variation in the resistance value $R_{par}$ of the parasitic resistor 212. For example, the resistance value $R_{par}$ of the parasitic resistor 212 varies with a temperature of the parasitic resistor 212. However, in an embodiment, the input stage 2-150 is configured to keep the voltage level $V_2$ substantially constant, as explained below. Thus, the phase shift of the input current $I_{IN}$ due to the voltage level $V_2$ is made insignificant.

Moreover, since the input stage 2-150 has a lower impedance value than the resistance value $R_{par}$ of the parasitic resistor 212, most of the first current $I_1$ flows into the input stage 2-150 so that the input current $I_{IN}$ has substantially the same value as that of the first current b. Since the leakage current $I_{leak}$ flowing through the parasitic resistor 212 is insignificant, the voltage level $V_2$ becomes less dependent on the variation of the resistance value $R_{par}$ of the parasitic resistor 212.

A phase shift of 90 degrees results from conversion of the first filtered voltage signal 2-115a to the first converted current signal 2-125a by the PCB capacitor 205. Since the phase shifts of the input current $I_{IN}$ due to an operation of the first resistor 225 and the voltage level $V_2$ are insignificant as discussed above, a total phase shift of the input current $I_{IN}$ becomes substantially equal to the phase shift resulting from an operation of the first PCB capacitor 205 (i.e., 90 degrees).

The second term of Equation 3 corresponding to the leakage current $I_{leak}$ represents a DC offset of the input current $I_{IN}$ due to the leakage current $I_{leak}$ flowing through the parasitic resistor 212. In an embodiment, the DC offset of the input current $I_{IN}$ is compensated using a digital filter included in the digital processor 1-170 (see FIG. 1).

In an embodiment, the input stage 2-150 includes first to fourth current sources 260, 270, 280, and 290, first and second analog amplifiers 285 and 275 (or first and second comparators 285 and 275), and first and second switches 265 and 275. For example, the first and second switches 265 and 275 are n-channel MOS transistor (NMOS). For illustrative convenience, operation of the input stage 2-150 is explained below with reference to the first and third current sources 260 and 280, the first analog amplifier 285, and the first switch 265.

The first current device 260 is configured to supply a common mode current $I_{CM}$ to a first output node $OUT_1$. The first analog current signal 2-135a is transmitted to another node, e.g., an analog-to-digital converter (see FIG. 3) through the first output node $OUT_1$.

A first terminal of the first switch 265 is connected to the first output node $OUT_1$ and a second terminal of the first switch 265 is connected to the first input node $IN_1$. A gate of the first switch 265 receives an output of the first analog amplifier 285.

A first input terminal of the first analog amplifier 285 is configured to receive a reference voltage $V_{REF}$ and a second input terminal of the first analog amplifier 285 is connected to the first input node $IN_1$.

In an embodiment, a feedback loop including the first switch 265, the first analog amplifier 285, and the first input node is configured to keep the voltage level $V_2$ at the first input node $IN_1$ substantially constant at the reference voltage $V_{REF}$. For example, when the voltage level $V_2$ is less than the reference voltage $V_{REF}$, the first analog amplifier 285 applies a higher gate voltage to the first switch 265. Since a voltage at the second terminal of the first switch 265 connected to the first input node $IN_1$ follows the gate voltage, the voltage level $V_2$ at the first input node $IN_1$ increases and becomes closer to the reference voltage $V_{REF}$. The voltage level $V_2$ continues to increase until the voltage level $V_2$ becomes substantially equal to the reference voltage $V_{REF}$.

The input stage 2-150 also includes the third current device 280 configured to pass a tail current $I_{TAIL}$ to a ground. One end of the third current device 280 is connected to the first input node $IN_1$.

Since the input current $I_{IN}$ flows into the first input node $IN_1$ and the tail current $I_{TAIL}$ flows out of the first input node $IN_1$, a current $I_s$ flowing into the first input node $IN_1$ through the first switch 265 is expressed as follows:

$$I_s = I_{TAIL} - I_{IN} \qquad \text{Equation 4.}$$

Since the common mode current $I_{CM}$ flows into the first output node $OUT_1$ and the current $I_s$ flows out of the first output node $OUT_1$, an analog current $I_{ALG}$ corresponding to the first analog current signal 2-135a is expressed as follows:

$$I_{ALG} = I_{CM} - I_s \qquad \text{Equation 5.}$$

In an embodiment, the common mode current $I_{CM}$ has substantially the same value as the current $I_s$. Using Equations 4 and 5, the first analog current $I_{ALG}$ is represented as:

$$I_{ALG} = I_{CM} - (I_{TAIL} - I_{IN}) \cong I_{IN} \qquad \text{Equation 6.}$$

As shown in Equation 6, the input stage 2-150 may provide the first analog current $I_{ALG}$ having substantially the same value as the input current $I_{IN}$ to an analog-to-digital converter (ADC), e.g., see FIG. 3.

FIG. 3 illustrates a system including a sigma-delta ADC 3-160 and a digital processor 3-170 according to an embodiment. The digital processor 3-170 includes a digital filter 360, a digital comparator 370, and a compensator 380.

In an embodiment, the sigma-delta ADC 3-160 includes comparators 330 and 340, capacitors 310 and 320, a current device 350, and an impulse control switch 335. The sigma-delta ADC 3-160 generates a digital signal 3-145 having a pulse-frequency that is proportional to a magnitude of an analog current signal 3-135 during a time interval t. In this embodiment, the sigma-delta ADC 3-160 generates a 1-bit data stream having zeros and ones such that the number of ones in the time interval t is a digital representation of the corresponding magnitude of the analog current signal 3-135.

The digital filter 360 filters the digital signal 3-145 to generate a sinusoidal waveform 371 and filters noise included in the sinusoidal waveform 371. In an embodiment, the digital filter includes a decimation filter 365 and a bandpass filter 375.

The decimator filter 365 receives the 1-bit data stream from the sigma-delta ADC 3-160 and generates multi-bit numbers (e.g., 3-bits, 8-bits) corresponding to the number of ones in the 1-bit data stream during the interval t. For example, a 1-bit data stream having four ones during an interval corresponding to the 8 digits "10010110," is converted into a 3-bit number, "100," by an 8:1 decimation filter. These multi-bit numbers are used to form the sinusoidal waveform 371.

The bandpass filter 375 passes signals of the sinusoidal waveform 371 that have a frequency spectrum within a certain passband to generate a filtered sinusoidal waveform 355. For example, the bandpass filter 375 includes a high-pass filter and a low-pass filter to stop signals of the sinusoidal waveform 355 outside a passband around 50-60 Hz.

The bandpass filter 375 reduces the risk of false zero-crossing detections. For example, the high-pass filter included in the bandpass filter 375 removes the DC offset that results from the parasitic resistor 212 (see FIG. 2) and high-frequency noise near the zero-value of the sinusoidal waveform 371.

The digital comparator 370 compares the filtered sinusoidal waveform 355 with a digital reference level to generate a comparison signal 385 indicating zero-crossings of the filtered sinusoidal waveform 355. The comparison signal 385 may be phase shifted with respect to the mains voltage signal 2-105 (see FIG. 2) resulting from the voltage-to-current converter 2-140 (see FIG. 2) and the digital filter 360.

The compensator 380 compensates for the phase shifts of the comparison signal 385. The compensator 380 is able to accurately compensate for these phase shifts because a phase shift caused by the voltage-to-current converter 2-140 is substantially equal to 90 degrees and a phase shift caused by the digital filter 360 is known. After compensating for the phase shifts, the compensator 380 generates an output signal 3-155 indicating the zero-crossings of the mains voltage signal 2-105 (see FIG. 2).

Figure 4:
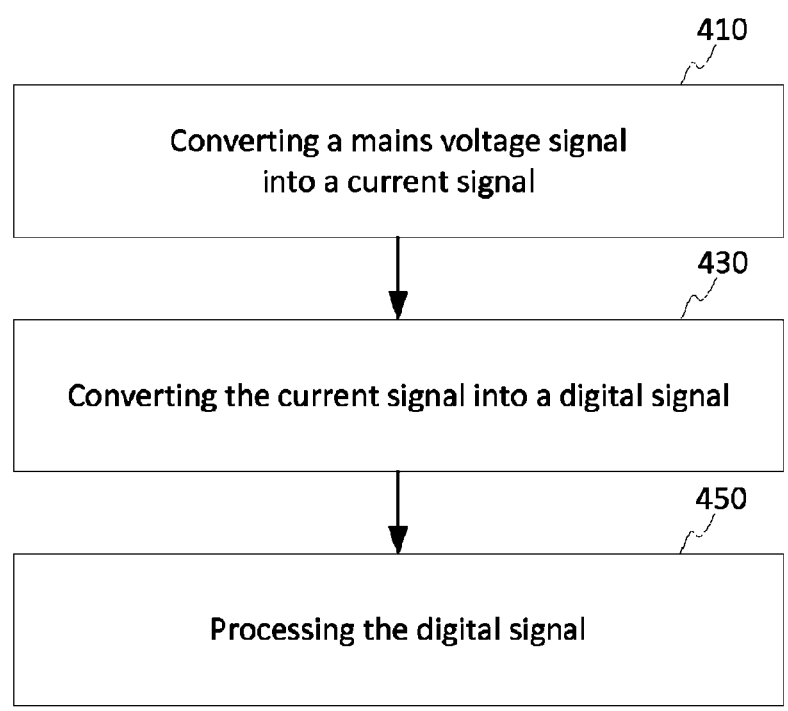
FIG. 4 is a flow chart of a method for detecting zero crossing points in accordance with an embodiment.

FIG. 4 is a flow chart of a method 400 for detecting zero-crossing points in accordance with an embodiment. The method may be used to detect zero-crossings of a mains voltage signal.

At 410, a voltage signal corresponding to a voltage signal (e.g., mains voltage signal) is converted into a current signal by a signal converter. The current signal is phase shifted by approximately 90 degrees with respect to the voltage signal.

At 430, the current signal is converted into a digital signal. In an embodiment, a sigma-delta ADC converts the current signal into the digital signal that is a digital representation of the corresponding magnitude of the current signal.

At 450, the digital signal is processed by a digital processor to generate an output signal indicating zero-crossings of the voltage signal. In an embodiment, the digital processor includes a decimation filter, a bandpass filter, a digital comparator, and a compensator.

Figure 5:
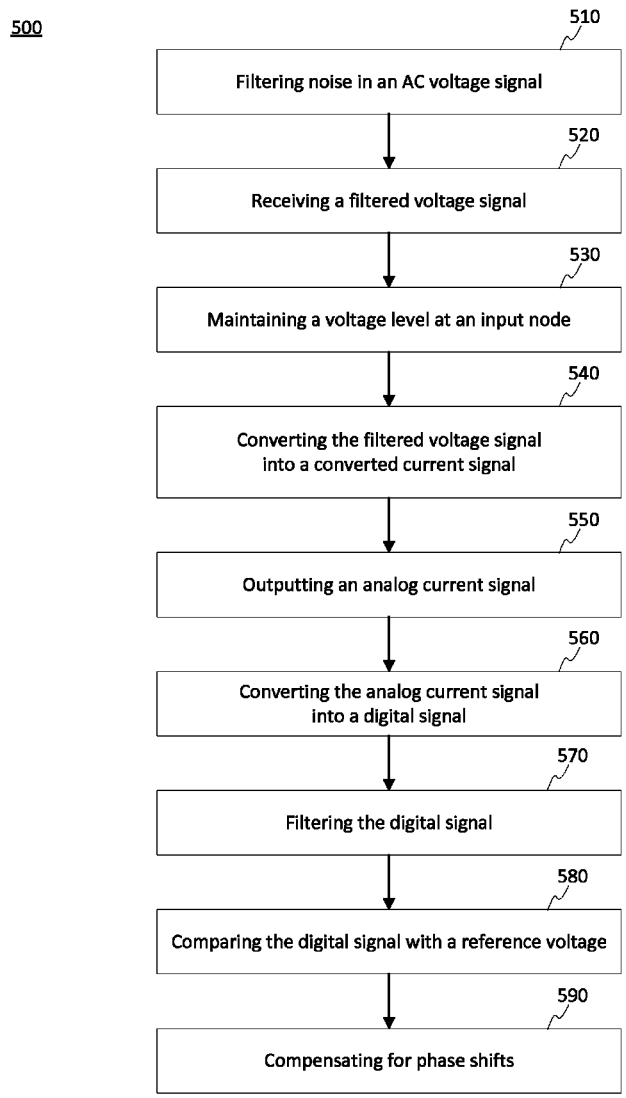
FIG. 5 is a flow chart of a method for detecting zero crossing points in accordance with an embodiment.

FIG. 5 is a flow chart of a method 500 for detecting zero-crossing points in accordance with an embodiment. The method may be used to detect zero-crossings of a mains voltage signal by compensating for a phase shift of a comparison signal with respect to the mains voltage signal.

At 510, the mains voltage signal is filtered to generate a tittered voltage signal. Filtering the mains voltage signal includes reducing high-frequency noise superimposed on the mains voltage signal. In an embodiment, the mains voltage signal includes differential voltage signals.

At 520, the filtered voltage signal is received by a voltage-to-current converter. In an embodiment, the voltage-to-current converter includes a capacitor and a resistor that are connected to each other in series.

At 530, a voltage level at an input node between the resistor of the voltage-to-current converter and an input stage is maintained. In an embodiment, maintaining the voltage level at the input node includes comparing the voltage level at the input node with a reference voltage using a feedback loop, outputting a control signal based on a comparison result, and adjusting the voltage level at the input node based on the control signal. For example, an input stage includes the feedback loop, which is used to keep the voltage level at the input node substantially equal to a reference voltage level. The input stage has a lower impedance value than a resistance value of a parasitic resistor connected to the input stage. As a result, the voltage level at the input node becomes less dependent on a variation in the resistance value of the parasitic resistor.

At 540, the voltage-to-current converter converts the filtered voltage signal into a current signal based on a difference between voltage levels of the filtered voltage signal and at the input node. In an embodiment, the converted current signal is phase shifted by approximately 90 degrees with respect to the filtered voltage signal. As a result, the input stage receives an input current corresponding to a difference between the converted current signal and a leakage current.

At 550, the input stage outputs an analog current signal to an ADC. In an embodiment, the analog current signal has substantially the same amplitude as the input current to the input stage.

At 560, the ADC converts the analog current signal into a digital signal. In an embodiment, converting the analog current signal into the digital signal includes receiving the converted digital signal having a pulse-frequency that is proportional to a magnitude of the analog current signal during a time interval. For example, if a sigma-delta ADC generates a 1-bit data stream having zeros and ones, the number of ones in a time interval is a digital representation of the corresponding magnitude of the analog current signal.

At 570, the digital signal is filtered by a digital filter to generate a filtered sinusoidal waveform. In an embodiment, the digital filter includes a decimation filter and a bandpass filter.

At 580, the sinusoidal waveform is compared with a reference voltage to generate a comparison signal indicating zero-crossings of the filtered sinusoidal waveform. In an embodiment, a digital comparator compares the filtered sinusoidal waveform with the digital reference level.

At 590, phase shifts in the comparison signal, which occur due to operations of the voltage-to-current converter and the digital filter, are compensated for to generate an output signal indicating the zero-crossings of the mains voltage signal. Since a phase shift due to the voltage-to-current converter is substantially equal to 90 degrees and a phase shift due to the digital filter is known, the zero-crossings of the mains voltage signal may be accurately detected.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A method comprising:
converting a voltage signal into a current signal, the voltage signal being based on a mains voltage signal;
converting the current signal into a digital signal; and
processing the digital signal to generate an output signal, the output signal indicating a zero crossing point of the mains voltage signal,
wherein an input stage receives the converted current signal, and
wherein an impedance value of the input stage is substantially smaller than that of a parasitic resistor coupled to the input stage in parallel, so that a phase shift of the converted current signal due to the parasitic resistor is minimized.

2. The method of claim 1, wherein the converted current signal is based on the voltage signal and a voltage level at an input node, and
wherein converting the voltage signal into the current signal comprises maintaining the voltage level at the input node so that the voltage level is substantially constant.

3. The method of claim 1, further comprising:
filtering the mains voltage signal to generate a filtered voltage signal,
wherein the voltage signal converted to the current signal is based on the filtered voltage signal.

4. The method of claim 3,
wherein converting the voltage signal into the current signal comprises:
receiving the filtered voltage signal by a voltage-to-current converter;
maintaining a voltage level at an input node coupling the voltage-to-current converter and the input stage so that the voltage level is substantially constant;
converting the filtered voltage signal into an intermediate current signal having a value proportional to a difference between a voltage level of the filtered voltage signal and the voltage level at the input node; and
providing the converted current signal to the input stage, the converted current signal corresponding to a difference between the intermediate current signal and a leakage current flowing through the parasitic resistor that is coupled to the input stage in parallel.

5. The method of claim 4, wherein maintaining the voltage level at the input node comprises:
comparing the voltage level at the input node with a reference voltage;
outputting a control signal based on a result of the comparison; and
adjusting the voltage level at the input node based on the control signal,
wherein, by maintaining the voltage level at the input node, a phase shift of the converted current signal due to a variation in the voltage level at the input node is substantially minimized.

6. The method of claim 4, further comprising:
outputting an analog current signal from the input stage to an analog-to-digital converter (ADC).

7. The method of claim 1, wherein converting the current signal into the digital signal comprises generating the digital signal having a pulse-frequency proportional to a magnitude of the current signal during a time interval.

8. The method of claim 1, wherein processing the digital signal to generate the output signal comprises:
filtering the digital signal to generate a sinusoidal waveform;
comparing the sinusoidal waveform with a reference voltage to generate a comparison signal;
compensating for phase shifts of the comparison signal with respect to the mains voltage signal; and
outputting the output signal having a zero-crossing point corresponding to the zero-crossing point of the mains voltage signal.

9. The method of claim 8, wherein the sinusoidal waveform is a first sinusoidal waveform, and
wherein filtering the digital signal comprises:
generating a second sinusoidal waveform using a decimation filter; and
filtering the second sinusoidal waveform using a bandpass filter.

10. An apparatus comprising:
a signal converter configured to convert a voltage signal into a current signal, the voltage signal being based on a mains voltage signal;
an input stage configured to receive the converted current signal and output an analog current signal to an analog-digital-converter (ADC);
the ADC configured to convert the analog current signal into a digital signal; and
a digital processor configured to process the digital signal to generate an output signal,
wherein the output signal indicates a zero crossing point of the mains voltage signal,
wherein an impedance value of the input stage is sufficiently smaller than that of a parasitic resistor coupled to the input stage in parallel, so that a phase shift of the converted current signal due to the parasitic resistor is minimized.

11. The apparatus of claim 10, wherein the signal converter comprises:
a filter configured to generate a filtered voltage signal; and
a voltage-to-current converter configured to convert the filtered voltage signal into an intermediate current signal.

12. The apparatus of claim 11,
wherein the voltage-to-current converter comprises:
a resistor coupled to a capacitor in series; and
the capacitor configured to convert the filtered voltage signal into the intermediate current signal having a value proportional to a difference between a voltage level of the filtered voltage signal and a voltage level at an input node coupling the resistor to the input stage, the voltage level at the input node being maintained substantially constant by the input stage, and
wherein the voltage-to-current converter provides the converted current signal to the input stage, the converted current signal corresponding to a difference between the intermediate current signal and a leakage current flowing through the parasitic resistor coupled to the input stage in parallel.

13. The apparatus of claim 12, wherein the converted current signal is based on the voltage signal and the voltage level at the input node, and
wherein the voltage level at the input node is maintained substantially constant so that a phase shift of the converted current signal due to a variation in the voltage level at the input node is substantially minimized.

14. The apparatus of claim 12,
wherein the input stage includes:
the input node coupling the voltage-to-current converter to the input stage;
a comparator configured to compare the voltage level at the input node with a reference voltage and output a control signal based on a result of the comparison; and
a switch configured to receive the control signal and adjust the voltage level at the input node based on the control signal, and
wherein, by maintaining the voltage level at the input node, a phase shift of the converted current signal due to a variation in the voltage level at the input node is substantially minimized.

15. The apparatus of claim 12, wherein the input stage includes further including:
an output node; and
an output path coupled to the output node and configured to output the analog current signal to the ADC, and wherein the analog current signal substantially corresponds to the converted current signal.

16. The apparatus of claim 10, wherein the ADC includes a sigma-delta ADC.

17. The apparatus of claim 10, wherein the digital processor includes:
   a digital filter configured to filter the digital signal to generate a sinusoidal waveform;
   a digital comparator configured to compare the sinusoidal waveform with a reference voltage and generate a comparison signal; and
   a compensator configured to compensate for phase shifts of the comparison signal with respect to the mains voltage signal to generate the output signal having a zero-crossing point corresponding to the zero-crossing point of the mains voltage signal.

18. The apparatus of claim 17, wherein the sinusoidal waveform is a first sinusoidal waveform, and
   wherein the digital filter includes:
   a decimation filter configured to generate a second sinusoidal waveform; and
   a bandpass filter configured to filter the second sinusoidal waveform.

\* \* \* \* \*